United States Patent
Mostafazadeh et al.

(10) Patent No.: US 6,352,878 B1
(45) Date of Patent: Mar. 5, 2002

(54) METHOD FOR MOLDING A BUMPED WAFER

(75) Inventors: Shahram Mostafazadeh, Santa Clara; Joseph O. Smith, Morgan Hill, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/596,838

(22) Filed: Jun. 19, 2000

(51) Int. Cl.[7] .......................... H01L 21/44; H01L 21/48
(52) U.S. Cl. ..................... 438/106; 438/108; 438/127
(58) Field of Search .................. 438/106, 107, 438/108, 26, 127, 114; 257/780, 782, 783, 787, 790; 430/315; 228/173.2

(56) References Cited

U.S. PATENT DOCUMENTS

| | | | | |
|---|---|---|---|---|
| 624,595 A | * | 5/1899 | Nguyen et al. | 438/108 |
| 5,478,700 A | * | 12/1995 | Gaynes et al. | 430/315 |
| 5,765,744 A | * | 6/1998 | Tatumi et al. | 228/224 |
| 5,817,545 A | * | 10/1998 | Wang et al. | 438/107 |
| 5,895,229 A | * | 4/1999 | Carney et al. | 438/106 |
| 5,975,408 A | * | 11/1999 | Goossen | 228/173.2 |
| 6,000,924 A | * | 12/1999 | Wang et al. | 425/125 |
| 6,093,972 A | * | 7/2000 | Carney et al. | 257/790 |

* cited by examiner

Primary Examiner—Michael S. Lebentritt
(74) Attorney, Agent, or Firm—Beyer Weaver & Thomas, LLP

(57) ABSTRACT

A method and apparatus for forming a layer of underfill encapsulant on an integrated circuit located on a wafer are described. The integrated circuit has electrically conductive pads, a plurality of which have solder balls attached thereto. To reduce the occurrence of voids during formation of the underfill layer, the wafer is placed in a mold cavity which is evacuated prior to injection of the underfill encapsulant.

11 Claims, 2 Drawing Sheets

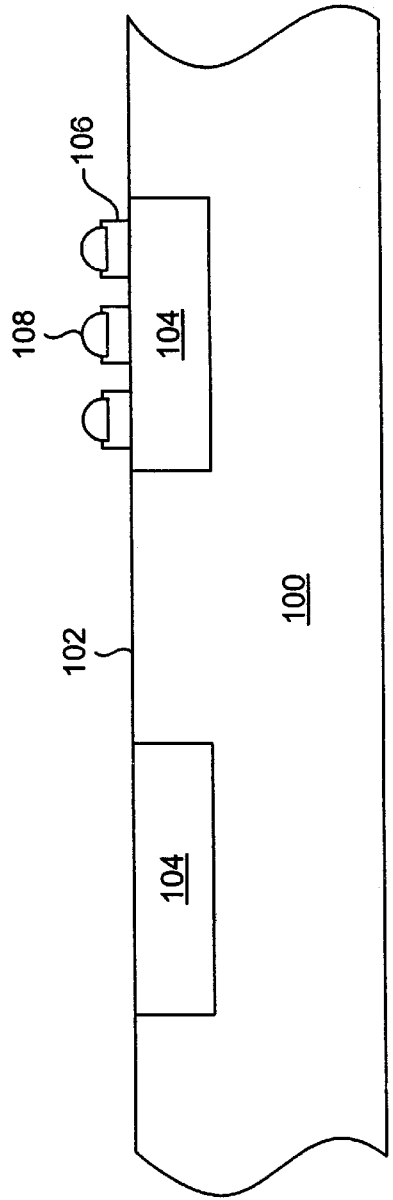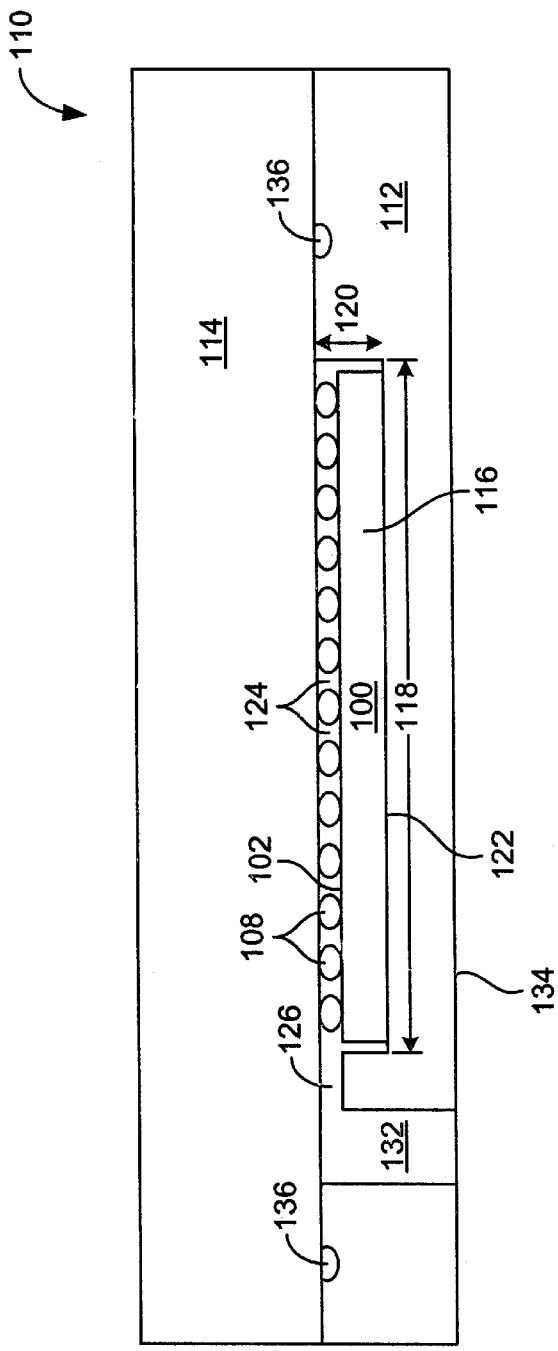

METHOD FOR MOLDING A BUMPED WAFER

CROSS REFERENCE TO RELATED APPLICATION

This application is related to co-pending application Ser. No. 09/359,074, filed Jul. 22, 1999, the specification of which is hereby incorporated by reference.

FIELD OF THE INVENTION

The present invention relates generally to flip chip packaging for integrated circuits. More particularly, it relates to flip chips that have an integral layer of underfill material and to methods for and apparatus for packaging such flip chips.

BACKGROUND OF THE INVENTION

There are a number of conventional methods for packaging integrated circuits. One approach, referred to as "flip chip" packaging, generally involves forming solder bumps (or other suitable contacts) directly on I/O pads formed on an integrated circuit die. The die is then typically attached to a substrate such as a printed circuit board or package substrate such that the die contacts directly connect to corresponding contacts on the substrate. That is, the die is placed on the substrate with the contact bumps facing corresponding contacts on the substrate. The solder contact bumps are then reflowed to electrically connect the die to the substrate.

When a flip chip is attached to the substrate, an air gap typically remains between flip chip and substrate. This gap is commonly filled with material that is flowed into the gap in liquid form and is then solidified. This material, a plastic material, is generally called "underfill". The underfill material is typically applied in liquid form from a dispenser at one edge of a flip chip. The material then flows into the narrow gap and spreads across the flip chip until the entire area of the gap between flip chip and substrate is filled. The underfill process improves reliability of the flip chip interconnect and lowers mechanical stress on the contacts.

There are problems associated with underfill. When the operation of applying underfill is repeated for each flip chip, manufacturing costs are relatively high. To address this issue and to lower manufacturing cost, wafer-level underfill processing is being developed. This process involves encapsulating an entire bumped wafer surface with underfill material prior to singulating the wafer into individual dies and attaching the dies to the board.

A method of encapsulating a bumped wafer surface is described in co-pending application Ser. No. 09/359,074, the specification of which has been incorporated herein by reference, wherein a wafer is paced into a mold with the wafer backside positioned on a bottom plate and a top plate placed atop the bumps, and underfill material is injected between the top plate and the wafer surface. However, encapsulating an entire bumped flip chip wafer presents new challenges.

One problem which arises is the creation of voids in the underfill material caused by air being trapped between the bumps. The typical height of a flip chip bump is 4 to 5 mils, and therefore the gap between the surface of the wafer and the top plate, i.e., the gap to be filled with underfill material, is approximately 4 mils. Typical pitches for the bumps are approximately 10 mils. With wafer diameters as great as 12 inches, it is extremely difficult to inject underfill material and completely fill the gap without voids, using methods currently in the art. Voids in the underfill material can adversely affect the mechanical strength and therefore the reliability of the interconnect. In addition, moisture can become trapped within voids, which when subjected to subsequent surface mount or other high temperature processes can cause corrosion or cracking. Therefore there is a need for improved wafer level underfill processes.

SUMMARY OF THE INVENTION

To achieve the foregoing and other objects and in accordance with the purpose of the present invention, a method and apparatus for forming a layer of underfill encapsulant on an integrated circuit wafer are disclosed.

In a preferred embodiment, the wafer includes integrated circuits having electrically conductive pads exposed on a surface of the wafer, a plurality of the electrically conductive pads having solder bumps thereon. The wafer is installed into a mold cavity, air is evacuated from the mold cavity, and a layer of underfill encapsulant is formed on the wafer surface while in the evacuated mold cavity. In the preferred embodiment, some of the integrated circuits are flip chip integrated circuits.

BRIEF DESCRIPTION OF THE DRAWINGS

FIG. 1 shows a cross sectional view of a portion of a wafer having integrated circuits therein and having solder bumps thereon.

FIG. 2 shows a cross sectional view of an embodiment of the present invention, wherein a solder bumped wafer is placed into mold.

DETAILED DESCRIPTION OF THE INVENTION

Figure 3:
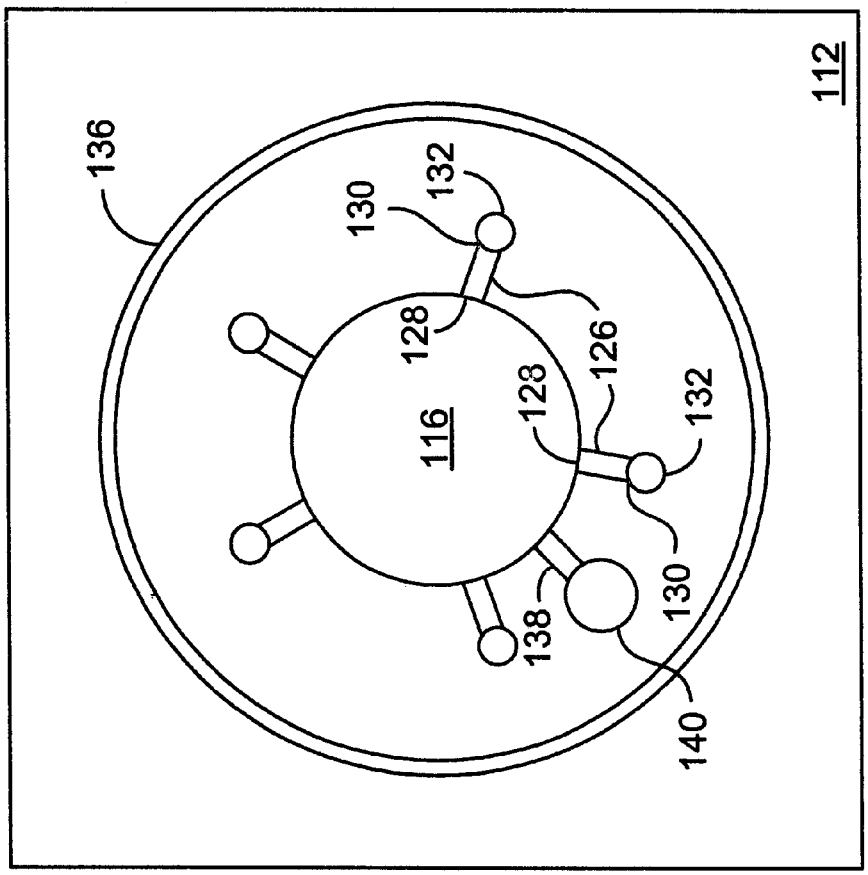
FIG. 3 shows a top view of the bottom platen of the mold.

The present invention will be described in terms of a flip chip style integrated circuit situated on a wafer suitable for forming a flip chip package. It will be understood by those skilled in the art that the invention can be applied to other types of packages as well, such as Quad Flat Pack (QFP) or other molded plastic packages used in integrated circuit manufacturing. In order not to unnecessarily obscure the present invention, well-known integrated circuit manufacturing steps are not described herein in detail.

FIG. 1 shows wafer 100 having top active surface 102 with a number of integrated circuits 104 therein, some of which are flip chip integrated circuits. At least some of the flip chip integrated circuits have underbump metallization pads 106. In the described embodiment, most of the underbump metallization pads have solder balls 108 formed during a solder bump operation. The solder balls are used to electrically couple the associated singulated flip chip integrated circuit to external circuitry, generally via a substrate.

FIG. 2 shows a side cross sectional view of a preferred embodiment of the present invention, wherein solder bumped wafer 100 is placed into mold 110 which is specifically designed to accommodate the wafer diameter and thickness. The mold includes a first mold portion which may be a bottom platen 112 and a second mold portion which may be a top platen 114. Wafer 100 fits into cavity 116 in bottom platen 112, which has diameter 118 and depth 120 chosen to fit the specific wafer. A layer of resilient material is placed between the bumps and the top platen, so that the depth of the cavity is slightly less than the thickness of the bumped wafer and so that the solder bumps are compressed against the top plate, thereby leveling them and assuring that there is no underfill material on the tops of the bumps. The wafer is held in place on the bottom platen by any suitable means, including mechanical clamping or vacuum suction applied to the wafer back surface 122. Gaps 124 between top surface 102 of wafer 100 and top platen 114 are to be filled with underfill material.

FIG. 3 is a top view of the bottom platen 112 of mold 110. Cavity 116 which holds wafer 100 is recessed into platen 112. Recessed vacuum channels 126 emanate from and are connected at one end 128 to cavity 116. The other ends 130 of vacuum channels 126 are connected to vacuum holes 132. Vacuum holes 132 are in general opened completely through to backside 134 of bottom platen 112. The shown arrangement of vacuum channels and holes is optional, and may be modified in any suitable way. A vacuum seal such as a high temperature vacuum O-ring seal surrounds cavity 116 and vacuum channels 126 and holes 132. Other types or configurations of vacuum seal may be used in place of the O-ring, metal gaskets being another example. When wafer 100 is placed into cavity 116 and top platen 114 is placed atop bottom platen 112 and O-ring seal 136, vacuum suction applied to the backside 134 of bottom platen 112 will evacuate cavity 116.

Underfill encapsulant 137 is flowed or injected into cavity 116 via channel 138 which is coupled at one end to cavity 116 and at the opposing end to a reservoir 140 that contains encapsulant 137. By way of example, reservoir 140 may take the form of a gang pot arrangement where the underfill encapsulant 137 contained therein is forced under pressure, by cylinders, into cavity 116. Other conventional molding techniques of injecting the encapsulant may be used as well.

During the underfill process according to this invention, the wafer 100 is placed into cavity 116, top platen 114 is placed atop bottom platen 112 and O-ring seal 136, vacuum suction is applied to backside 134 of bottom platen 112 thereby evacuating cavity 116, and subsequently encapsulant 137 is injected into evacuated cavity 116 via channel 138. According to this method, the encapsulating plastic will flow freely on the wafer and between bumps 108, without trapping air and creating voids. The vacuum suction may be applied prior to injection of the encapsulant and sealed off during the injection process. Alternatively, vacuum suction may be continuously applied during the injection process. Any underfill material which entered the vacuum channels would remain attached to the wafer and would thereby be pulled out when the wafer was removed from the cavity.

Subsequent to filling cavity 116 with encapsulant 137, processing continues with pre-curing, removal from mold 110, and singulation or dicing operations in which the individual integrated circuits are separated from one another. The singulated die are ready for final assembly into a flip chip package.

Use of this inventive method and apparatus provides for improved wafer level underfill processing. Formation of a vacuum in the cavity prior to and/or during injection of the encapsulant greatly reduces the occurrence of voids and therefore improves both the mechanical strength and reliability of the flip chip interconnect.

In the above description, numerous specific details have been set forth in order to provide a thorough understanding of the present invention. In view of this description, it should be obvious to those skilled in the art that the present invention may be embodied in a wide variety of specific configurations. By way of example, the contacts need not be solder balls. Rather, any suitable die contacts can be under filled using the described technique. It is understood that the present invention is not restricted to the exact details set forth for the embodiment described herein, and that changes or modifications may be made without departing from the inventive concept. The present example is to be considered as illustrative and not restrictive, and the scope of the invention should be construed in view of the claims.

With this in mind, we claim:

1. A wafer level method for forming a substantially void-free layer of underfill encapsulant on a bumped wafer surface, said bumped wafer comprising integrated circuits formed in a wafer, said wafer having solder bumps thereon, said solder bumps having top surfaces, the method comprising:
   installing said wafer in a mold cavity;
   evacuating said mold cavity having said wafer therein;
   flowing said underfill encapsulant into said mold cavity to form a layer of said underfill encapsulant on said wafer surface, said top surfaces of said solder bumps remaining free of said underfill encapsulant.

2. The method of claim 1, wherein at least one of the integrated circuits is a flip chip integrated circuit suitable for encapsulation in a flip chip package, said integrated circuit having electrically conductive pads exposed on a surface of the wafer, a plurality of said electrically conductive pads having said solder bumps thereon.

3. The method of claim 1, wherein said mold cavity is formed in a mold having a first mold portion and a second mold portion, said first mold portion having a front surface and a back surface.

4. The method of claim 3, wherein said step of installing said wafer in said cavity comprises:
   providing said first mold portion, said front surface of said first mold portion having a recessed cavity therein, said recessed cavity being suitably arranged to receive said wafer and said encapsulant;
   placing said wafer in said recessed cavity with said bumped wafer surface exposed;
   enclosing said recessed cavity with said second mold portion;
   forming a vacuum seal between said first mold portion and said second mold portion, said vacuum seal surrounding said cavity to provide a vacuum sealed cavity having said wafer therein.

5. The method of claim 4, wherein said step of enclosing said recessed cavity with said second mold portion includes flattening said top surfaces of said solder bumps against said second mold portion.

6. The method of claim 4 wherein said step of forming a vacuum seal between said first mold portion and said second mold portion comprises compressing a vacuum O-ring between said first mold portion and said second mold portion.

7. The method of claim 4 wherein said step of evacuating said cavity comprises providing at least one vacuum channel connecting said vacuum sealed cavity to a source of vacuum suction.

8. The method of claim 7 wherein said step of evacuating said cavity further comprises:
   providing said first mold portion with at least one vacuum channel having a first end and a second end, said vacuum channel being recessed into said front surface of said first mold portion and communicating with said recessed cavity, said vacuum channel emanating from and being connected at said first end to said cavity;
   said second end of said vacuum channel being connected to a vacuum hole opened to said back side of said first mold portion;

said vacuum seal surrounding said vacuum channel and said cavity;

applying vacuum suction to said vacuum hole at said back side of said first mold portion.

9. The method of claim 1 wherein said step of flowing said underfill encapsulant into said cavity comprises injecting said underfill encapsulant under pressure into said mold cavity.

10. An integrated circuit wafer having at least one flip chip integrated circuit in an active surface of said wafer, said flip chip integrated circuit being suitable for encapsulation in a flip chip package, said flip chip integrated circuit having a plurality of solder bumps thereon, said solder bumps having top surfaces, said wafer having a substantially void-free layer of underfill encapsulant on said active wafer surface, said top surfaces of said solder bumps being free of underfill encapsulant, said layer of underfill encapsulant being formed by the method of;

installing said wafer in a mold cavity;

evacuating said mold cavity having said wafer therein; and flowing said underfill encapsulant into said mold cavity.

11. The integrated circuit wafer of claim 10, wherein:

said mold cavity is formed in a mold having a first mold portion and a second mold portion, said first mold portion having a front surface and a back surface;

said step of installing said wafer in said cavity comprises:

providing said first mold portion, said front surface of said first mold portion having a recessed cavity therein, said recessed cavity being suitably arranged to receive said wafer and said encapsulant;

placing said wafer in said recessed cavity with said bumped wafer surface exposed;

enclosing said recessed cavity with said second mold portion;

flattening said top surfaces of said solder bumps against said second mold portion; and forming a vacuum seal between said first mold portion and said second mold portion by compressing a vacuum O-ring between said first mold portion and said second mold portion, said O-ring surrounding said cavity to provide a vacuum sealed cavity having said wafer therein;

said step of evacuating said cavity comprises:

providing said first mold portion with at least one vacuum channel having a first end and a second end, said vacuum channel being recessed into said front surface of said first mold portion and communicating with said recessed cavity, said vacuum channel emanating from and being connected at said first end to said cavity;

said second end of said vacuum channel being connected to a vacuum hole opened to said back side of said first mold portion; and applying vacuum suction to said vacuum hole at said back side of said first mold portion;

said step of flowing said underfill encapsulant into said cavity comprises injecting said underfill encapsulant under pressure into said mold cavity.

\* \* \* \* \*